(12) United States Patent
Dijksman et al.

(10) Patent No.: US 10,481,498 B2
(45) Date of Patent: Nov. 19, 2019

(54) DROPLET GENERATOR FOR LITHOGRAPHIC APPARATUS, EUV SOURCE AND LITHOGRAPHIC APPARATUS

(71) Applicant: ASML Netherlands B.V., Veldhoven (NL)

(72) Inventors: Johan Frederik Dijksman, Weert (NL); Bastiaan Lambertus Wilhelmus Marinus van de Ven, Rosmalen (NL); Koen Gerhardus Winkels, 's Hertogenbosch (NL); Theodorus Wilhelmus Driessen, San Diego, CA (US); Georgiy O. Vaschenko, San Diego, CA (US); Peter Michael Baumgart, Pleasanton, CA (US); Wilhelmus Henricus Theodorus Maria Aangenent, Eindhoven (NL); Jan Okke Nieuwenkamp, Enschede (NL); Wim Ronald Kampinga, Deventer (NL); Jari Ruotsalainen, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/061,847

(22) PCT Filed: Dec. 15, 2016

(86) PCT No.: PCT/EP2016/081161
§ 371 (c)(1),
(2) Date: Jun. 13, 2018

(87) PCT Pub. No.: WO2017/102931
PCT Pub. Date: Jun. 22, 2017

(65) Prior Publication Data
US 2018/0364580 A1 Dec. 20, 2018

Related U.S. Application Data

(60) Provisional application No. 62/416,027, filed on Nov. 1, 2016, provisional application No. 62/268,937, filed on Dec. 17, 2015.

(51) Int. Cl.
*G03F 7/20* (2006.01)
*H05G 2/00* (2006.01)

(52) U.S. Cl.
CPC ......... *G03F 7/70033* (2013.01); *H05G 2/006* (2013.01); *H05G 2/008* (2013.01)

(58) Field of Classification Search
USPC ..................................................... 250/504 R
See application file for complete search history.

(56) References Cited

U.S. PATENT DOCUMENTS 6,864,497 B2    3/2005    Orsini et al.
7,599,470 B2 *  10/2009   Kloepfel ................ H05G 2/003
                                                250/504 R (Continued)

FOREIGN PATENT DOCUMENTS

AU    2002325589 A2    4/2003
DE    102006017904 A1  10/2007

(Continued)

OTHER PUBLICATIONS

Matthias Meixner, European International Searching Authority, International Search Report, counterpart PCT Application No. PCT/EP2016/081161, dated Jun. 7, 2017, 5 pages total.

(Continued)

*Primary Examiner* — Phillip A Johnston
(74) *Attorney, Agent, or Firm* — DiBerardino McGovern IP Group LLC

(57) ABSTRACT

Droplet generators, such as used in an EUV radiation source, and associated EUV radiation sources and lithographic (Continued)

apparatuses. A droplet generator can include a nozzle assembly to emit the fuel as droplets, the nozzle assembly being within a pressurized environment at substantially the same pressure as the fuel pressure within the droplet generator. A droplet generator can include an actuator in contact with and biased against a pump chamber by means of a biasing mechanism having an actuator support biased against the actuator. The actuator acts on the fuel within the pump chamber to create droplets. The actuator support has a material with a greater coefficient of thermal expansion than its surrounding structure, such that it is moveable within the surrounding structure at ambient temperature, but expands against the surrounding structure at an operating temperature, so as to clamp the actuator support against the surrounding structure at the operating temperature.

21 Claims, 8 Drawing Sheets

(56) References Cited

U.S. PATENT DOCUMENTS

| | | | |
|---|---|---|---|
| 7,872,245 B2 * | 1/2011 | Vaschenko | H05G 2/003 156/345.24 |
| 9,125,285 B2 * | 9/2015 | Umeda | H05G 2/008 |
| 2002/0005877 A1 | 1/2002 | Silverbrook | |
| 2006/0017026 A1 | 1/2006 | Hergenhan et al. | |
| 2006/0192153 A1 | 8/2006 | Bykanov et al. | |
| 2006/0192157 A1 | 8/2006 | Gaebel et al. | |
| 2008/0067456 A1 | 3/2008 | Kloepfel et al. | |
| 2009/0230326 A1 | 9/2009 | Vaschenko et al. | |

FOREIGN PATENT DOCUMENTS

| | | |
|---|---|---|
| WO | 2009032055 A1 | 3/2009 |
| WO | 2009117048 A2 | 9/2009 |
| WO | 2011082894 A1 | 7/2011 |
| WO | 2012136343 A1 | 10/2012 |
| WO | 2014082811 A1 | 6/2014 |

OTHER PUBLICATIONS

Matthias Meixner, European International Searching Authority, Written Opinion, counterpart PCT Application No. PCT/EP2016/081161, dated Feb. 7, 2017, 9 pages total.

* cited by examiner

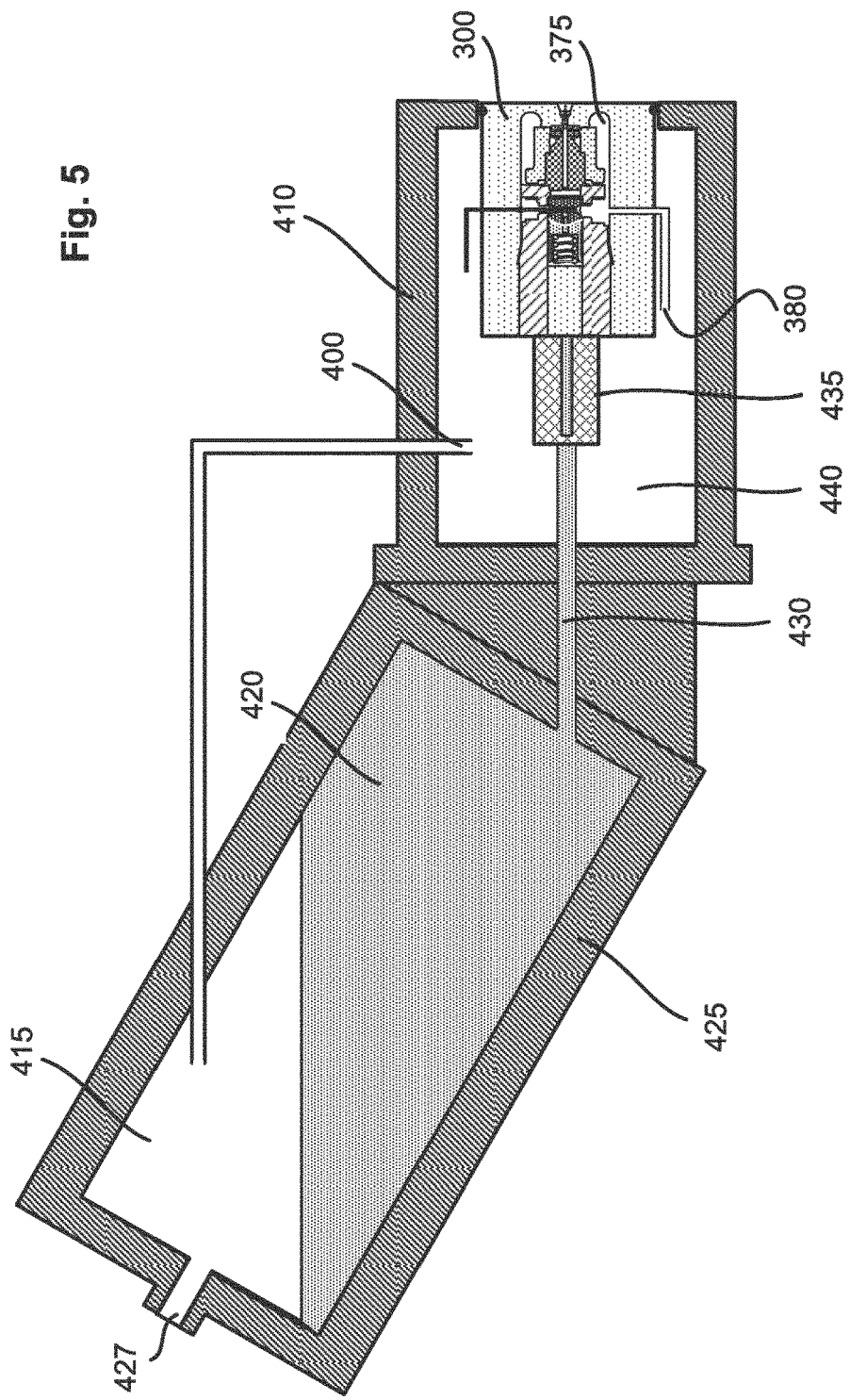

DROPLET GENERATOR FOR LITHOGRAPHIC APPARATUS, EUV SOURCE AND LITHOGRAPHIC APPARATUS

CROSS-REFERENCE TO RELATED APPLICATIONS

This application claims priority of U.S. application 62/268,937 which was filed on Dec. 17, 2015 and U.S. application 62/416,027 which was filed on Nov. 1, 2016 and which are both incorporated herein in their entirety by reference.

FIELD

The present description relates to a lithographic apparatus and a specifically to a droplet generator for an EUV source within or for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

SUMMARY

A proposed LPP radiation source generates a continuous stream of fuel droplets. The radiation source comprises a droplet generator for directing fuel droplets toward a plasma formation location. It may be desirable to use driving gas pressures, for driving the fuel from a reservoir through a nozzle, greater than is possible with existing droplet generator designs.

In an aspect, there is provided a droplet generator for a lithographic system, the droplet generator operable to receive fuel pressurized at a fuel pressure, the droplet generator comprising a nozzle assembly operable to emit the fuel in the form of droplets, wherein the nozzle assembly is within a pressurized environment or wherein the nozzle assembly is substantially within a pressurized environment, the pressurized environment being pressurized substantially at the same pressure as the fuel pressure.

In an aspect, there is provided a droplet generator for a lithographic system, the droplet generator being operable to emit fuel in the form of droplets out of a nozzle and comprising an actuator in contact with, and biased against, a pump chamber by means of a biasing mechanism comprising an actuator support which is biased against the actuator, the actuator operable to act on the fuel within the pump chamber so as to cause breakup of the fuel such that the fuel is output from the nozzle as droplets, wherein the actuator support is comprised of a material with a greater coefficient of thermal expansion than its surrounding structure, such that it is moveable within the surrounding structure at ambient temperature, but expands against the surrounding structure at an operating temperature of the droplet generator, so as to clamp the actuator support against the surrounding structure at the operating temperature.

In an aspect, there is provided a droplet generator for a lithographic system, the droplet generator operable to emit fuel in the form of droplets out of a nozzle and comprising an actuator in contact with and biased against a pump chamber by means of a biasing mechanism comprising an actuator support which is biased against the actuator, the actuator operable to act on the fuel within the pump chamber so as to cause the breakup of the fuel such that the fuel is output from the nozzle as droplets, wherein the actuator support is comprised of a first part and a second part separated by an articulated joint allowing rotational movement between the first part and the second part so as to enable parallel alignment of the contacting surfaces of the actuator support and the actuator.

In an aspect, there is provided a droplet generator for a lithographic system, the droplet generator being operable to emit fuel in the form of droplets out of a nozzle and comprising an actuator in contact with, and biased against, a pump chamber by means of a biasing mechanism comprising an actuator support which is biased against the actuator, the actuator operable to act on the fuel within the pump chamber so as to cause breakup of the fuel such that the fuel is output from the nozzle as droplets, wherein the nozzle is divergent or convergent in the direction of exhaust of the fuel from the nozzle.

In an aspect, there is provided a method of manufacturing a nozzle plate for a droplet generator, the method comprising using laser ablation to manufacture an orifice through a plate of material to at least partly form the nozzle of the nozzle plate.

In an aspect, there is provided a method of manufacturing a nozzle plate for a droplet generator, the method comprising using inductive coupled plasma etching with a hard mask, to manufacture an orifice through a plate of material to form the nozzle of the nozzle plate.

In an aspect, there is provided a droplet generator for a lithographic system being operable to emit fuel in the form of droplets out of a nozzle and comprising an actuator in contact with and biased against a pump chamber by means of a biasing mechanism comprising a plurality of wedges configured to displace the actuator to deform a membrane between the actuator and the pump chamber, wherein at least one wedge of the plurality of wedges is displaceable in a sliding manner relative to another wedge of the plurality of wedges and the actuator is operable to act on the fuel within the pump chamber so as to cause the breakup of the fuel such that the fuel is output from the nozzle as droplets.

In an aspect, there is provided an EUV radiation source comprising: a droplet generator as described herein, configured to generate droplets of fuel towards a plasma generation location; and a laser configured to direct laser radiation at the droplets at the plasma formation location to generate, in use, a radiation generating plasma; and also a lithographic apparatus comprising such a droplet generator.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 3:
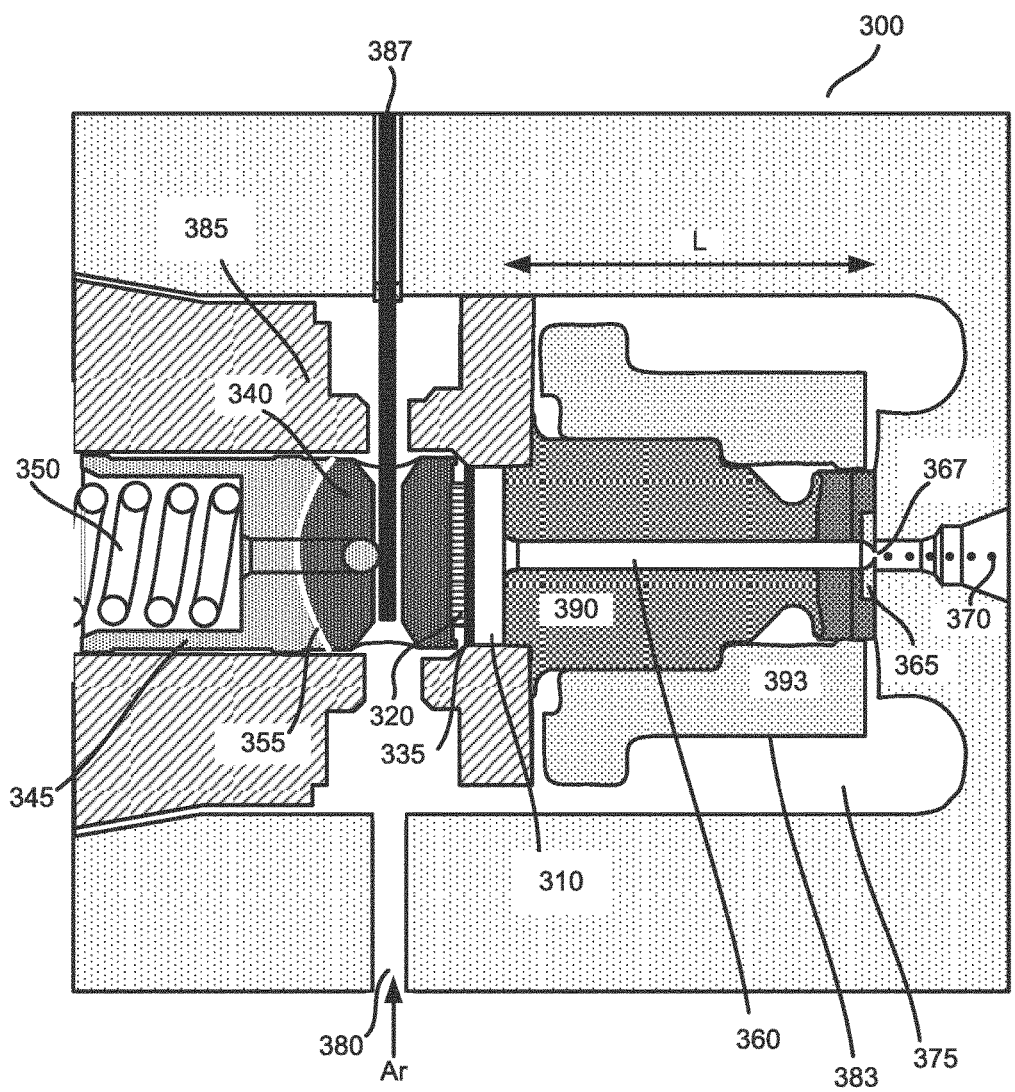
Figure 4:
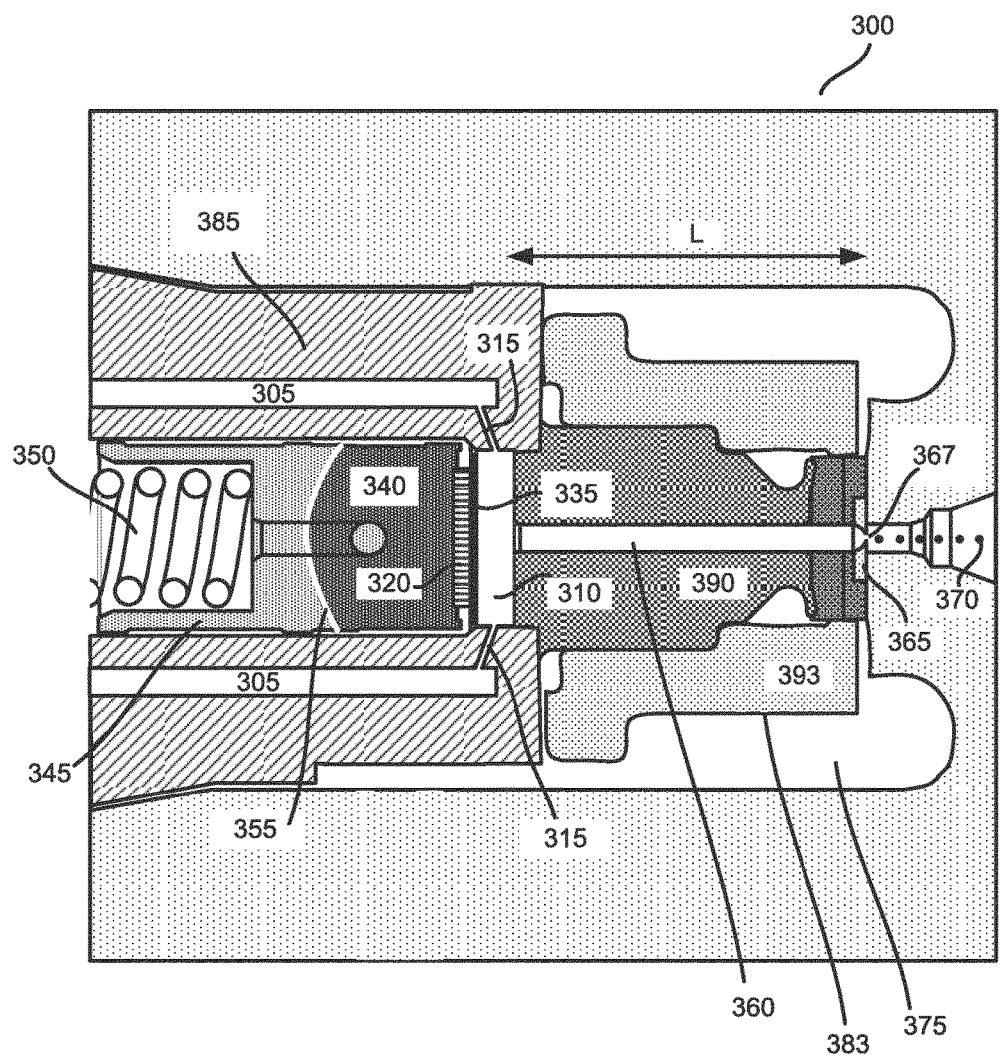
Figure 6A:
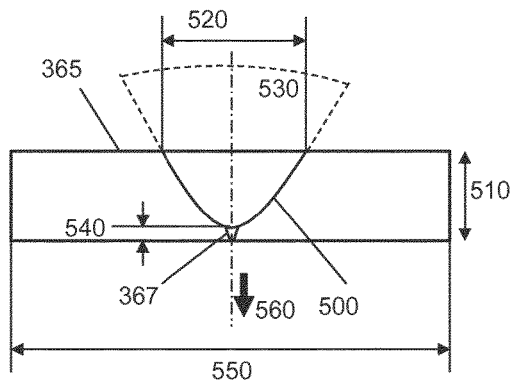
Figure 6B:
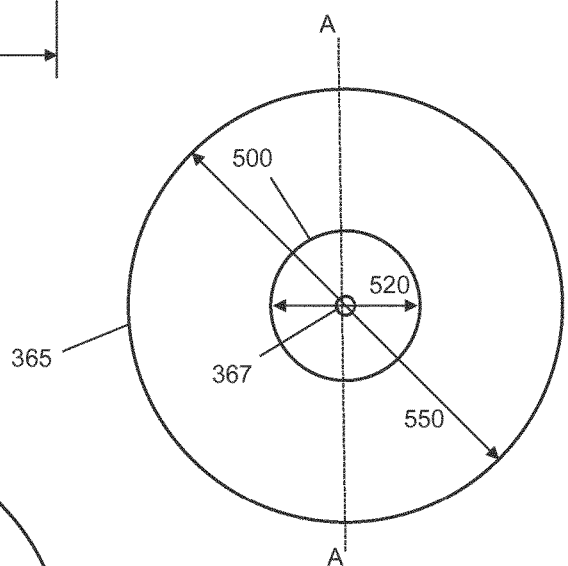
Figure 6C:
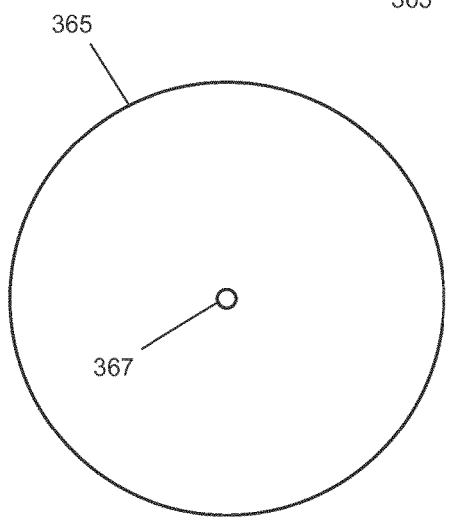
Figure 7:
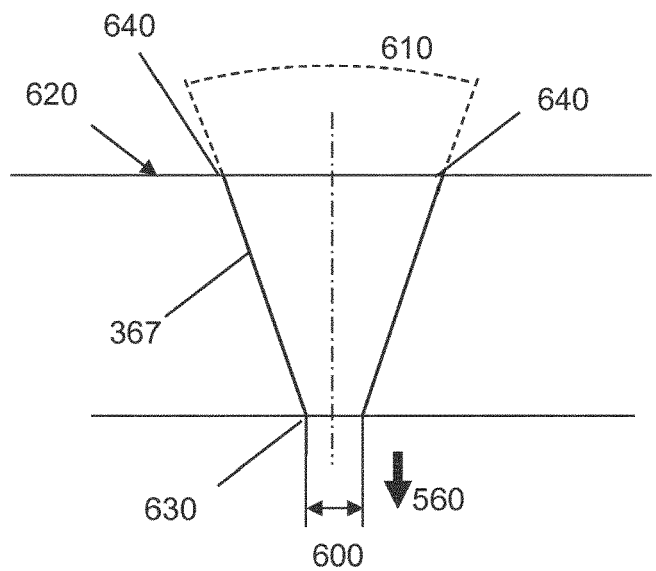
Figure 8:
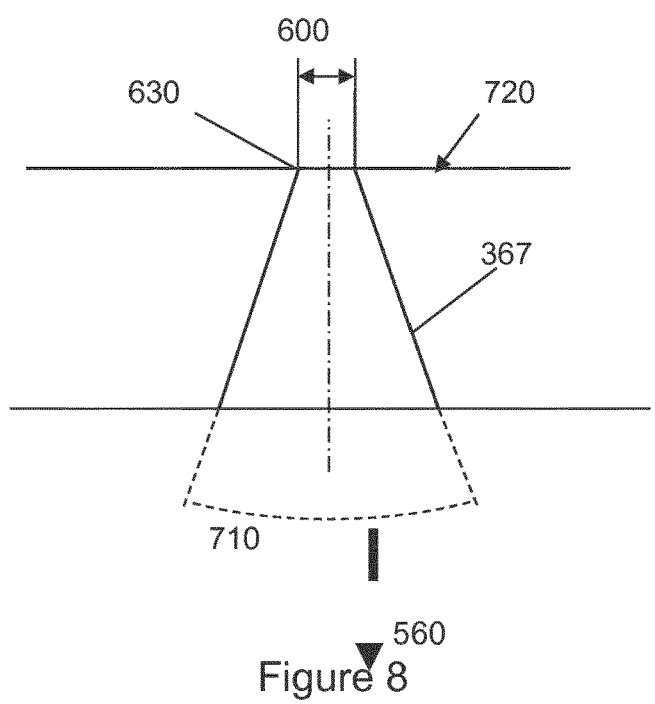
Figure 9:
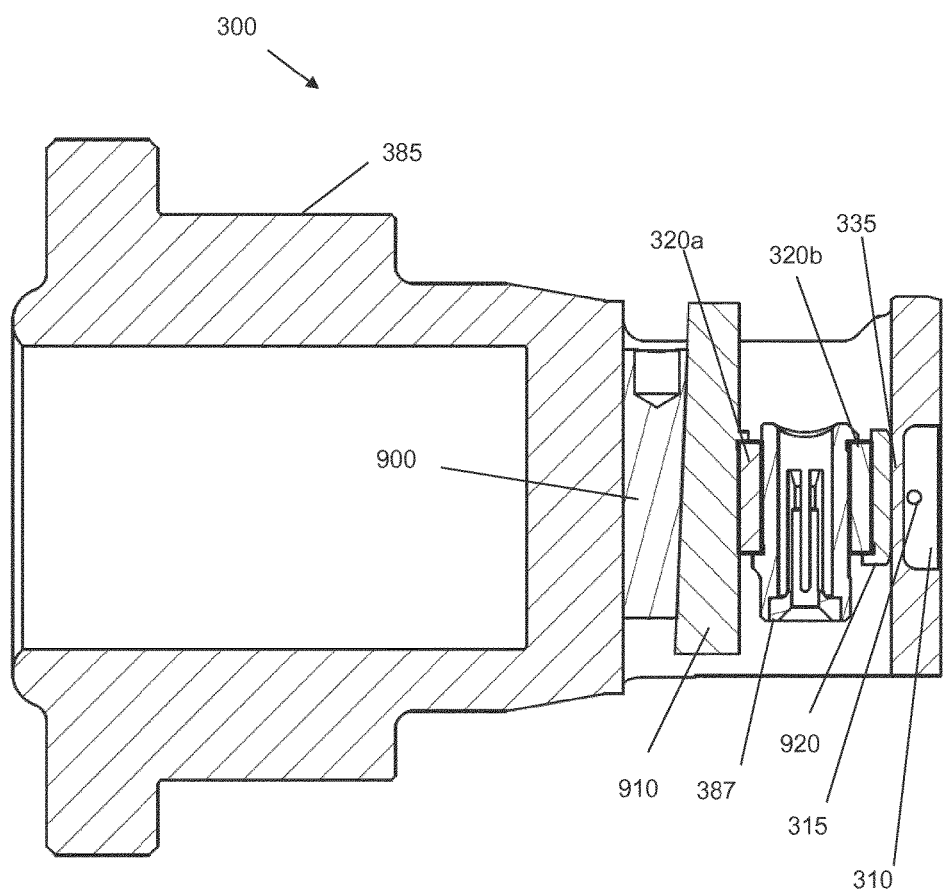
Figure 10:
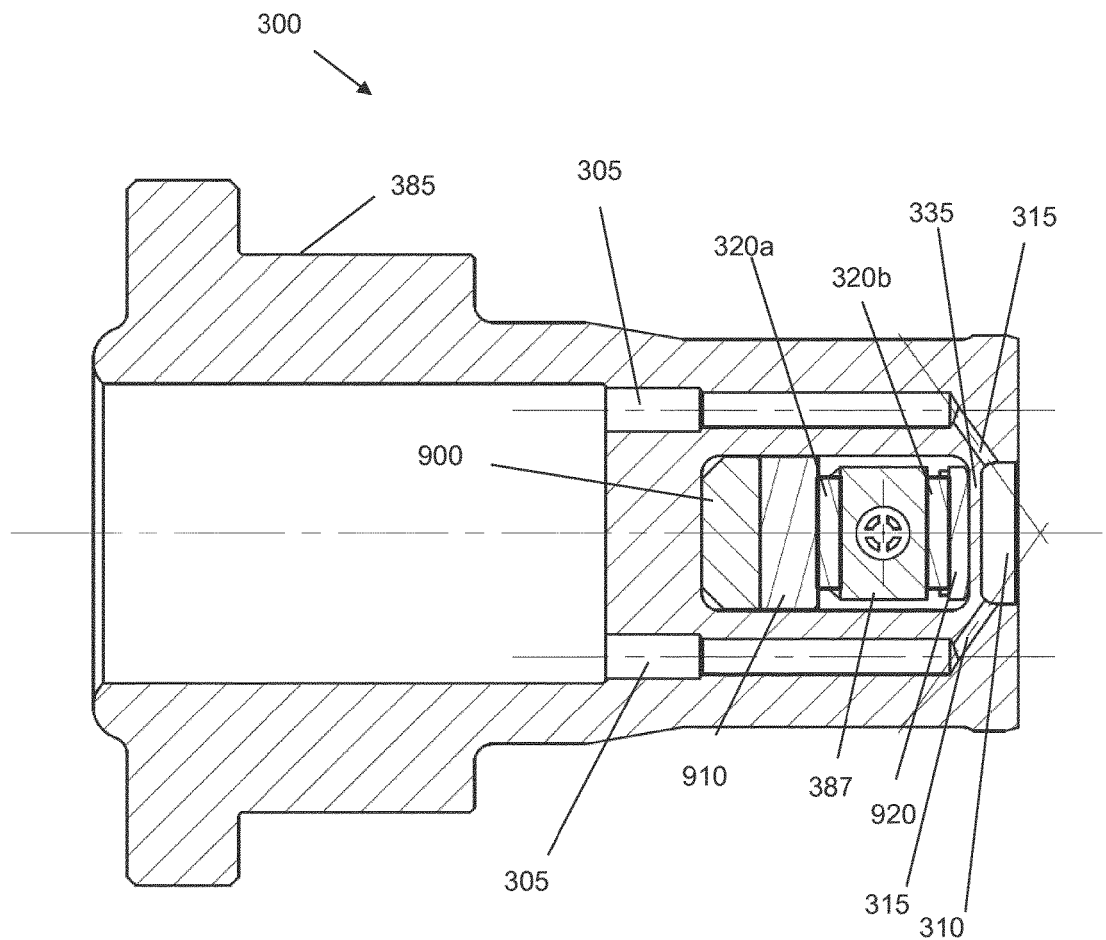

FIG. 3 schematically depicts in first cross section a droplet generator of a radiation source configured to direct a stream of fuel droplets along a trajectory towards a plasma formation location, according to an embodiment;

FIG. 4 schematically depicts in second cross section, through a plane perpendicular to that of the first cross section, the droplet generator of FIG. 3;

FIG. 5 schematically depicts the droplet generator of FIGS. 3 and 4 within its housing and coupled to a fuel supply reservoir;

FIG. 6A schematically depicts a cross-sectional view of a nozzle structure along line A-A of FIG. 6B;

FIG. 6B schematically depicts a top view of a nozzle structure;

FIG. 6C schematically depicts a bottom view of a nozzle structure;

FIG. 7 schematically depicts a close-up cross-sectional view of the nozzle in the configuration depicted in FIGS. 6A-6C;

FIG. 8 schematically depicts a close-up cross-sectional view of the nozzle in a different configuration than depicted in FIGS. 6A-6C;

FIG. 9 schematically depicts an embodiment of a part of a droplet generator in a first cross section; and FIG. 10 schematically depicts an embodiment of a part of a droplet generator in a second cross section through a plane perpendicular to that of the first cross section.

The features and advantages of embodiments will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

Figure 1:
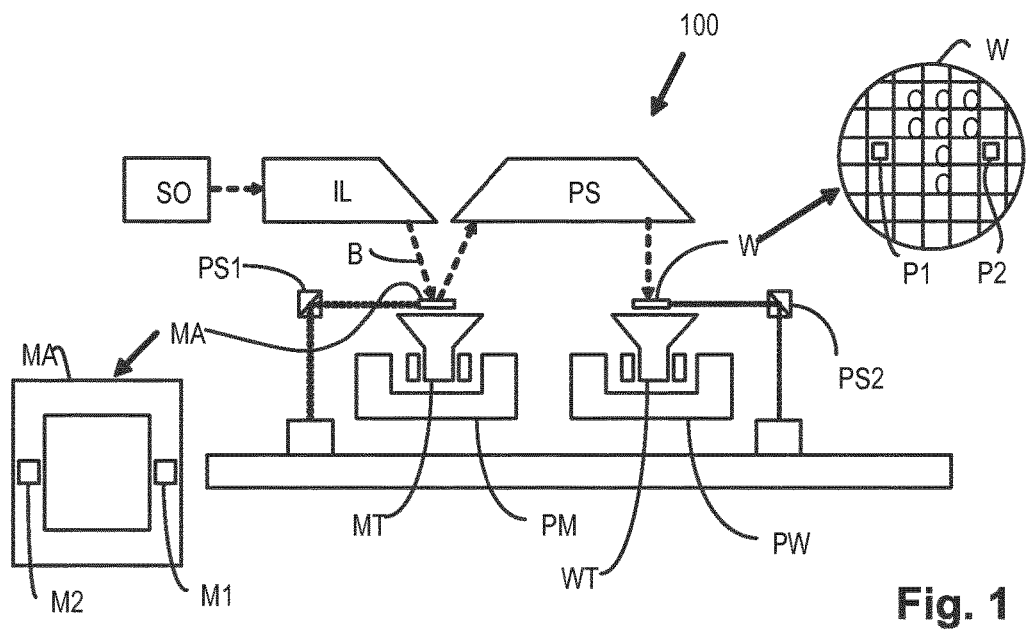
FIG. 1 depicts schematically a lithographic apparatus having reflective projection optics.

FIG. 1 schematically depicts a lithographic apparatus 100 including a source collector module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
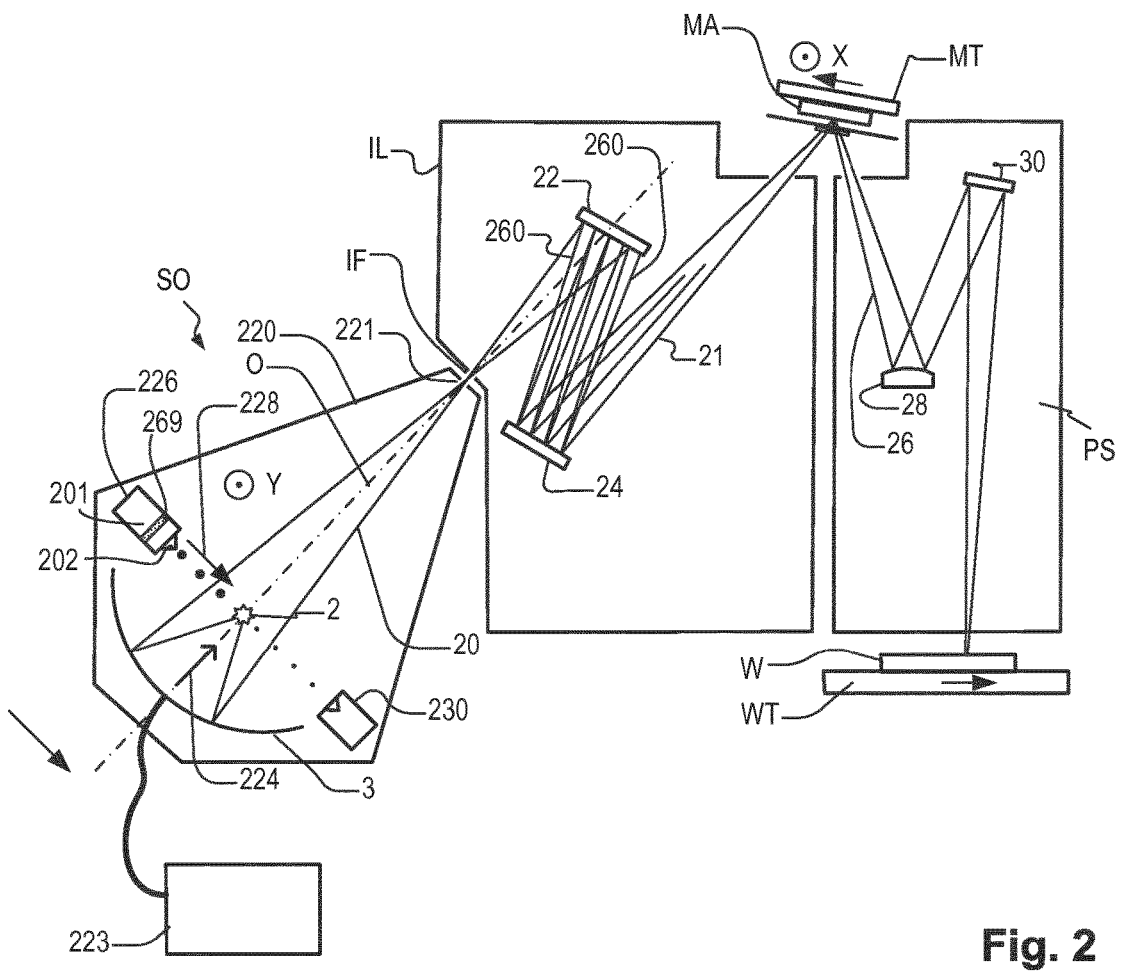
FIG. 2 is a more detailed view of the apparatus of FIG. 1.

FIG. 2 shows an embodiment of the apparatus 100 in more detail, including the source collector module SO, the illumination system IL, and the projection system PS. The source collector module SO is constructed and arranged such that a vacuum environment can be maintained in an enclosing structure 220 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 2.

From the aperture 221 at the intermediate focus IF, the radiation traverses the illumination system IL, which in this example includes a faceted field mirror device 22 and a faceted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 260). Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2.

Considering source collector module SO in more detail, a laser energy source comprising laser 223 is arranged to deposit laser energy 224 into a fuel, such as xenon (Xe), tin (Sn) or lithium (Li), creating the highly ionized plasma 2 with electron temperatures of several 10's of eV. Higher energy EUV radiation may be generated with other fuel materials, for example Tb and Gd. The energetic radiation generated during de-excitation and recombination of these ions is emitted from the plasma, collected by a near-normal incidence collector 3 and focused on the aperture 221. The plasma 2 and the aperture 221 are located at first and second focal points of collector CO, respectively.

Although the collector 3 shown in FIG. 2 is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which for example is liquid tin, a droplet generator 226 is arranged within the enclosure 220, arranged to fire a high frequency stream 228 of droplets towards the desired location of plasma 2. In operation, laser energy 224 is delivered in a synchronism with the operation of droplet generator 226, to deliver impulses of radiation to turn each fuel droplet into a plasma 2. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 2. A trap 230 is provided on the opposite side of the enclosing structure 220, to capture fuel that is not, for whatever reason, turned into plasma.

The droplet generator 226 comprises a reservoir 201 which contains the fuel liquid (e.g. molten tin) and a filter 269 and a nozzle 202. The nozzle 202 is configured to eject droplets of the fuel liquid towards the plasma 2 formation location. The droplets of fuel liquid may be ejected from the nozzle 202 by a combination of pressure within the reservoir 201 and a vibration applied to the nozzle by a piezoelectric actuator (not shown).

As the skilled reader will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 228, while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Numerous additional components critical to operation of the source collector module and the lithographic apparatus as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus.

Disclosed is a droplet generator which can accommodate higher pressures within the droplet generator, and in particular enables the (e.g., molten tin) fuel to be driven from the reservoir and through the nozzle using a driving gas with higher pressure than is presently possible. As will be described in detail below, the droplet generator may be of the Helmholtz type. The droplet generator may comprise a cylindrical-conical connection between a pump chamber and the nozzle.

FIGS. 3 and 4 show a droplet generator 300 in respectively a first cross section and a second cross section through a plane perpendicular to that of the first cross section. The droplet generator 300 comprises, in this embodiment, two fuel supply channels 305. The fuel supply channels 305 receive fuel under pressure from the fuel reservoir via a main filter. The droplet generator 300 may optionally comprise one or more than two fuel supply channels 305 depending on the embodiment; however, a symmetrical distribution of the fuel channels around the droplet axis is preferred. This main filter may be similar to filter 269 of droplet generator 226 in FIG. 2. The fuel supply channels 305 are connected to a pump chamber 310 via smaller channels (restrictions) referred to herein as throttles 315. The fuel supply channels 305, throttles 315 and (at least part of) the pump chamber 310 may be all formed within a fuel modulator housing 385. An actuator 320 is located close to pump chamber 310. In this example, the actuator 320 comprises a piezo disk or plate, though it may be any suitable actuator for generating droplets. The actuator may be separated from pump chamber 310 by membrane 335, to ensure that the actuator 320 is not contacted by the metal fuel. In an embodiment, the membrane 335 comprises the wall of pump chamber 310 which contacts actuator 320.

On the other side of the actuator 320 is an actuator support structure. The actuator support structure may comprise the actuator support 340 and associated guide block 345 which is pre-stressed against the actuator by helical spring 350. An electrical connection 387 to the actuator is shown. Optionally, in the specific embodiment shown, the actuator support 340, which is conductive, forms part of the actuator circuit, while the guide block 345 is insulating. In such an embodiment, the fuel modulator housing 385 may comprise the other electrode of the actuator 320.

Optionally, in the specific embodiment shown, the actuator support 340 and guide block 345 are articulated to allow relative rotational movement. This may be achieved by providing mutually curved faces forming a ball type joint 355.

A nozzle assembly 383 may comprise a duct 360 and a nozzle structure (e.g., a plate) 365 in series. Nozzle structure 365 provides the outlet for the duct 360, and comprises a nozzle orifice 367 through which the fuel droplets 370 are emitted. The orifice may be small, for example smaller than 10 μm. The nozzle structure 365 may be relatively short compared to present designs, and may be comprised of a strong, non-fragile, material, such that it can withstand the pressure differential between the pressurized fuel and the near vacuum environment of the source chamber. Such materials may comprise, for example a metal (e.g., titanium, tungsten, molybdenum and rhenium, in general all refractory metals), silicon or a silicon based compound, such as silicon nitride, silicon carbide or for very high pressure application diamond. Here nozzle structure 365 is shown in the form of a nozzle plate comprising such a material. The nozzle orifice in the nozzle structure 365 can be made by laser drilling or etching. Duct 360 may be drilled into a component such as a ring end piece or v-ring 390. Nozzle assembly 383 may comprise a support structure 393 for supporting the v-ring 390 and nozzle structure 365.

The actuator 320 may be polarized in its thickness direction. The thickness of actuator 320 changes with electrical actuation of the actuator 320. Through the flexible membrane 335 this displacement is transmitted to the fuel within the pump chamber 310, resulting in a pressure change in the molten fuel. This pressure change initiates waves travelling back and forth through the duct 360. At the orifice 367 these pressure waves are transferred into velocity perturbations.

The fuel is held in a reservoir which is heated to keep the fuel (e.g., tin) molten. To maintain the flow of fuel, the fuel is pressurized by a fluid e.g., a gas, such as argon gas. The pressure drop comprises three components: the Bernoulli pressure drop which scales with the square of the jet velocity, viscous drag which scales with the jet velocity and surface tension which is a constant and independent of the jet velocity. This pressure is provided by the pressurization of the fuel within the reservoir (the reservoir pressure). At higher velocities, the Bernoulli pressure drop begins to dominate strongly. The environment in which the droplet generator is to be used is a low pressure (e.g., close to vacuum) environment of the source chamber. This results in large pressure differentials between the pressurized tin path (from tin reservoir to nozzle structure 365) and the surrounding environment. As a consequence there is a limit on the reservoir pressure that the droplet generator can withstand. This, in turn, imposes a limit on the attainable jet velocity and droplet frequency.

Additionally, seals separating the pressurized fuel and surrounding environment, which include membrane 335, need to be sufficiently strong to handle the pressure differential. However, a thinner (and therefore weaker) membrane 335 may be preferred as this enables better acoustic coupling between actuator 320 and the contents of the pump chamber 310.

To address this, droplet generator 300 is of an isostatic design. In one embodiment, this isostatic design is implemented in only the region around nozzle assembly 383, actuator 320 and actuator support structure 340, 345, 350. To achieve this, the same (e.g., argon) fluid supply as that used to pressurize the fuel supply (or a different supply providing the same pressure) is connected to a volume 375 around the nozzle assembly 383, actuator 320 and actuator support structure 340, 345. The gas supply may be introduced via an inlet such as fluid inlet 380. Connecting the reservoir gas supply to volume 375 in this way equalizes the pressure of the environment surrounding the elements of which the fuel fluid path is comprised with the reservoir pressure. In an embodiment, there may also be a direct connection to pressurize the space (to reservoir pressure) between the actuator 320, where it is contacted by actuator support 340.

FIG. 5 illustrates another embodiment where the entire droplet generator assembly is pressurized by introduction of pressurizing fluid (e.g., a gas such as argon) within the casing 410 housing the droplet generator 300. This may be achieved by a fluid inlet 400 connecting a reservoir gas supply 415, which pressurizes a fuel supply 420 held in a fuel reservoir 425 (via inlet 427), to within the droplet generator casing 410. The pressurization of the fuel supply 420 pushes the fuel out of the reservoir 425, through conduit 430 and, via tin filter 435, to fuel supply channels 305 of droplet generator 300, and then into the pump chamber 310 and out through the nozzle of the nozzle structure 365. The pressurization within the casing 410 may, for example, pressurize a volume 440 around a tin filter 435 and the fuel conduit 430. This fluid inlet 400 may be additional to the fluid inlet 380 through which gas is admitted to pressurize the volume 375 around the nozzle assembly, actuator and actuator support structure. Of course, alternative designs where a single inlet pressurizes volume 375 and volume 440, or any other alternative arrangement which results in an isostatic design, such that the environment surrounding some or all of the elements making up the fuel path to the nozzle structure 365 of droplet generator 300 is at the same or similar pressure to the pressurized fuel within these elements, is possible and many such alternatives are envisaged.

Referring to FIGS. 3 and 4, it was mentioned previously that there may be a direct connection to pressurize the space behind the actuator 320, where it is contacted by actuator support 340. There are significant benefits to providing a gas, such as argon gas, between the actuator 320 and the actuator support 340 and membrane 335, whether by such a direct connection or otherwise. The actuator 320 should be tightly coupled with the membrane and the actuator support 340, for good transmission of the electrically induced motion of the actuator 320 to the contents of pump chamber 310. This can be done, for example, by applying adhesive or a pre-stress. In the embodiment shown, a pre-stress (e.g.

spring 350) is used in combination with the thin argon layer in the space between the actuator 320 and the actuator support 340, and in the space between the actuator 320 and membrane 335.

Although the actuator 320 is in a direct mechanical contact with each of the actuator support 340 and membrane 335, and the contacting surfaces are finished with high precision, full contact cannot be guaranteed. Argon at high pressure becomes a supercritical fluid with a high density (120 m/s, $\Delta p=550$ bar, $\rho_{argon}=391$ kg/m$^3$; 250 m/s, $\Delta p=2500$ bar, $\rho_{argon}=1021$ kg/m$^3$; 500 m/s, $\Delta p=9000$ bar, $\rho_{argon}=1564$ kg/m$^3$). As such, the argon gas acts effectively as a mechanical transmitter of pressure in the sub-micron gaps (due to roughness and imperfections) between the contacting surfaces of the actuator 320 and each of the actuator support 340 and membrane 335. Argon fills these gaps and cannot leave because of its mass. The higher the frequency of the actuator 320 the better the mechanical coupling.

In order to control the pre-stress a helical compression spring 350 is present. This helical compression spring 350 is mounted and compressed such that a force is generated that complies with the desired pre-stress force. The actuator support 340 may be mounted such that it is moveable back and forth when the droplet generator is at room temperature. However, in an optional embodiment, the pre-stress arrangement may be such that a clamping action is actuated when the droplet generator is at operating temperature (e.g., 10 to 20° C. above the melting point of tin, this being 232° C. at ambient pressure and 260° C. at 9000 bar). In an embodiment, this may be achieved by providing for a difference between the thermal expansion of actuator support 340 and its surrounding structure (the inside of the fuel modulator housing 385). This thermal expansion difference may be chosen such that actuator support 340 expands against the inside wall(s) of the fuel modulator housing 385 such that a tight connection is made, effectively clamping the actuator support 340 in position when at operating temperature. In this configuration the spring is no longer active, and the actuator support 340 is clamped against the actuator 320 by this clamping alone. Further heating results in an increasing clamping force at the fuel modulator housing 385 as well as at the actuator 320. Eventually, the fuel modulator housing 385 material begins to yield and both the clamping force against the fuel modulator housing 385 and the clamping force against actuator 320 reaches a plateau. To control the level of clamping it is possible to heat the clamping arrangement during assembly to a temperature (slightly) above the operating temperature and then allow it to cool. During this procedure the actuator 320 may be run in by driving it at a high voltage. This may act to help smooth any roughness between the mating surfaces.

This thermally induced clamping of the actuator support 340 is advantageous from an acoustical point of view. The actuator 320 is clamped by the large mass of housing, while the pre-stressing force is predictable and reliable from the moment of assembly up to final operation.

In order to ensure that the contact pressure between actuator 320 and membrane 335 is evenly distributed, an articulated joint, for example a ball-type joint 355 can be provided. This joint 355 may allow for rotational articulation between the actuator support 340 and its support structure and transmission of the pre-force of the compression helical spring 350 which, as shown in FIGS. 3 and 4, comprises guide block 345. This provides better alignment between the two lateral faces of the actuator 320, even if these faces are not perfectly parallel.

The guide block 345, in contact with the helical spring 350, may be comprised of an electrically insulating material. The actuator support 340 may be comprised of a conducting material, e.g. brass, possibly gold plated. The conductive actuator support 340 may form part of the electrical contact to the actuator 320. The other face of the actuator 320 is connected via the housing to ground. The actuator 320 may be driven between ground and the output socket of e.g. an arbitrary waveform generator.

As a result of a design such as that illustrated in FIG. 5, the only part of the droplet generator subject to the difference in reservoir pressure and its environment (the vacuum of the source) is the nozzle structure 365. The nozzle may be made within a small platelet, which part can be comprised of a number of different molten tin compatible materials, e.g. molybdenum, tungsten, rhenium, diamond or silicon (with the surface covered with silicon nitride for compatibility with molten tin), silicon carbide. For very high pressures up to 10,000 bar, diamond should be used. Accurate orifices can be made by laser machining or etching.

In an embodiment of this disclosure, the droplets may be produced with a method called low frequency modulated continuous jet. With this method a continuous jet is decomposed in small droplets by a high frequency close to the Rayleigh frequency. These droplets, however, because of the low frequency modulation, will have slightly different velocities. In course of their flight, high speed droplets overtake low speed droplets and coalesce into larger droplets spaced at a large distance. The large distance helps to avoid the plasma influencing the trajectory of the droplets. In order to keep the collector clean from condensing fuel, high energy ions and high speed fuel fragments, directed hydrogen gas flows transport these contaminants away. The amount of fuel used is a compromise between EUV power generated and contamination of the inside of the source, especially parts in the optical path, such as the collector.

A controller controls the actuator 320 so as to control the size and separation of the droplets 370 of fuel. In an embodiment the controller controls the actuator 320 according to a signal having at least two frequencies. A first frequency is used to control the droplet generator 300 to produce relatively small droplets of fuel. This first frequency may be in the region of MHz. The second frequency is a lower frequency in the kHz range. The second frequency of the signal may be used to vary the speed of the droplets as they exit the nozzle orifice 367 of the droplet generator 300. The purpose of varying the speeds of the droplets is to control the droplets such that they coalesce with each other so as to form larger droplets 370 of fuel, spaced at a corresponding larger distance. Note that, as an alternative to applying a low frequency modulation, an amplitude modulation may be considered as well. The nozzle of the droplet generator may be configured as part of a Helmholtz resonator, as explained in PCT patent application publication no. WO2014/082811, herein incorporated in its entirety by reference. The coalescence behavior may be further enhanced by adding harmonics in between the driving frequency and the Rayleigh frequency. In this respect a block wave with adjustable duty may be used to obtain shorter coalescence lengths.

Fuel droplets may be approximately spherical, with a diameter about 30 μm, usually less than the minimal dimension of the waist of the focused laser beam, being 60-450 μm. Droplets may be generated at frequencies between 40 to 310 kHz and fly towards the plasma formation location with velocities between 40 to 120 m/s, or even faster (up to 500 m/s). Desirably, the inter-droplet spacing is larger than about 1 mm (e.g., between 1 mm and 3 mm). The coalescence process may comprise between 100 to 300 droplets coalescing to form each of the larger droplets.

The flow arrangement has two characteristic key note frequencies. A first of these is the Helmholtz frequency, as will be described below. At the Helmholtz frequency $v_{helmholz}$, the fluid (fuel) portions contained in the throttles 315 (surface area $A_{throttle}$, length $L_{throttle}$ and number of throttles n) and the orifice 367 (surface area $A_{orifice}$, length $L_{orifice}$) vibrate in anti-phase against the stiffness of the fluid contained in the pump chamber 310 and the duct 360 connecting the pump chamber 310 with the nozzle structure 365 and against the main part of the conical nozzle (volume $V_c$). The Helmholtz frequency $f_{helmholz}$ in the specific example given may be provided by:

$$f_{helmholz} = \frac{c}{2\pi} \sqrt{\frac{1}{V_c}\left(\frac{A_{orifice}}{L_{orifice}} + n\frac{A_{throttle}}{L_{throttle}}\right)} \quad (2)$$

The wave speed c is the speed of sound corrected for the compliance of the surroundings.

The second of the characteristic key note frequencies is the quarter wave length mode frequency. At this frequency a quarter wave length fits into the fluid contained in the duct 360 and the main part of the nozzle structure 365 (total length L as labelled in FIGS. 3 and 4). The fluid motion at the orifice 367 is considered stationary, while at the pump chamber 310 the pressure is considered constant. The quarter wavelength frequency $f_{quarterwave}$ may be given by:

$$f_{quarterwave} = \frac{c}{4L} \quad (3)$$

The wave speed c is the speed of sound corrected for the compliance of the surroundings.

In the system there are numerous other resonance frequencies, partly coupled to the fluid path, partly coupled to fluid structure interaction and partly of the structure surrounding the fluid path. These include inter alia:

The thickness resonance of the actuator 320 (half wavelength mode thickness) can be used to control the Rayleigh break-up. This frequency depends on the thickness of the platelet and can be as high as 10-20 MHz. When higher frequencies are needed (for high speed droplet generators) overtones can be used.

In the fuel supply channels 305 towards the throttles 315, standing waves can absorb energy; this lowers the transfer of energy towards the nozzle structure 365. As a consequence, the fuel supply channels 305 should be careful designed to avoid this.

In the pump chamber 310 and in the duct 360, standing waves at frequencies that are an integer multiple higher than the driving frequency can help to control the overall coalescence by initially coalescing small droplets into intermediate sized droplets.

In the proposed design the quarter wavelength mode is chosen for the low driving frequency (the frequency of the final droplet stream after coalescence). This frequency is only dependent on the quarter wavelength tube defined by the length L between the inlet of the duct 360 and the orifice 367 and on the compliance of the surroundings. This frequency is not strongly dependent on small dimensional changes (due to changes in operating pressure and temperature) and variations in dimensions between different droplet generators. The Helmholtz frequency may be chosen to be significantly lower than this (e.g., at least a factor of two).

A significant parameter of the design is the so-called Q-factor at resonance. This factor gives the amplification of the input signal. On the one hand, the larger the Q-factor the more effective the coupling between input signal (a harmonic time varying electrical signal, the droplet frequency) and the output (the velocity amplitude in the nozzle). On the other hand a high Q-factor confines the proper action to a narrow frequency band. The actual value of the Q-factor is a compromise between amplification and sensitivity to small changes in driving frequency or small deviations in resonance frequency due to structural changes (e.g., by deterioration of actuator properties, aging of adhesives, gradual clogging of the nozzle). At resonance the Q-factor is maximal, its value is lowered by damping due to viscous dissipation and structural damping in the parts containing the molten fuel. The energy loss can be reduced by placing an acoustic filter near the inlet of the quarter wavelength tube (e.g., near the inlet of duct 360). The fuel then flows from the reservoir 425, through the main fuel filter 435, then through the acoustic filter, through the resonator and finally though the nozzle of the nozzle structure 365. Insertion of the acoustic filter at this location can increase the Q-factor of the resonator and therefore the coalescence performance of the droplet generator. Furthermore, insertion of the acoustic filter can also improve the stability of the coalescence by reducing the transmission of acoustic disturbances that can enter the resonator from the reservoir side.

The acoustic filter can be implemented in different ways, e.g. a restriction and a Helmholtz resonator. These two can also be combined. In the example given the throttle(s) 315 function as the acoustic filter and the pump chamber 310 functions as the Helmholtz resonator for vibrations coming from upstream.

The length L between the pump chamber 310 and the nozzle orifice 367 of the nozzle structure 365 determines the operating frequency, as given by Equation (3) above. A large length L provides a low operating frequency, for high frequency operation the length should be small. So by careful selection of this length L (e.g., the length of duct 360 and the distance across the nozzle structure 365) the design is scalable for a wide choice of droplet frequencies. By way of example, for 80 kHz operation the length L is about 6 mm and for 320 kHz the length L is 1.5 mm; these examples for a wave speed of 2000 m/s, which is lower than the isentropic speed of sound of molten tin because of the compliance of the parts containing the tin.

In an embodiment, the droplet generator is designed to deliver droplets at high speed and at larger droplet spacing to enable, e.g., a 350 W or greater output power sources. The high speed is achieved at least in part by increasing the pressure. For example, the pressure may be greater than or equal to 8,000 psi, for example, greater than or equal to 10,000 psi, greater than or equal to 11,000 psi, greater than or equal to 12,000 psi, or greater than or equal to 13,000 psi. To help accommodate the pressure, a mechanical arrangement such as depicted in FIGS. 3-5 can be used.

A particular component subject to such high pressure is the nozzle structure 365 having the orifice 367 to provide the droplets. FIGS. 6A, 6B, 6C, 7 and 8 show schematic views of embodiments of the nozzle structure 365 and the orifice 367. FIGS. 6A, 6B, 6C, 7 and 8 are not to scale. FIG. 6A schematically depicts a cross-sectional view of the nozzle structure 365 along line A-A of FIG. 6B, which shows a top view of the nozzle structure 365. FIG. 6B schematically depicts a top view of the nozzle structure 365, although the top here faces leftward in FIGS. 3-5. FIG. 6C schematically depicts a bottom view of the nozzle structure 365, although the top here faces rightward in FIGS. 3-5. FIG. 7 schematically depicts a close-up cross-sectional view of the nozzle orifice 367 in the configuration depicted in FIGS. 6A-6C. FIG. 8 schematically depicts a close-up cross-sectional view of the nozzle orifice 367 in a different configuration than depicted in FIGS. 6A-6C.

In an embodiment, the nozzle structure 365 is a relatively small component. In an embodiment, the nozzle structure 365 has a cross-sectional width 550 (e.g., diameter) selected from the range of about 1 mm-10 mm. In an embodiment, the nozzle structure 365 has a thickness 510 selected from the range of about 0.1 mm-1 mm. Further, the nozzle structure 365 has a relatively small orifice 367. In an embodiment, the orifice 367 has a cross-sectional width 600 (e.g., diameter) selected from the range of about 1 µm-10 µm or selected from the range of about 2.5 µm-5.5 µm, or selected from the range of about 3.5 µm-4.5 µm. In an embodiment, the orifice 367 has a non-zero opening angle 610, 710 selected from the range of up to, and including, 40 degrees. The geometric specifications are significant to creating the correct size and/or stream of droplets.

In an embodiment, the nozzle structure 365 is made of one or more fuel compatible materials. In an embodiment, the nozzle structure 365 is made of a high strength material to enable it to withstand high pressures. In an embodiment, the nozzle structure 365 is made of one or more materials selected from: diamond, tungsten, SiC, tantalum, silicon, rhenium, and/or $Al_2O_3$. The high strength material has a better lifetime expectancy in a high pressure, high temperature environment than, e.g., a glass capillary. In an embodiment, the nozzle structure 365 is made of one or more materials that are not brittle. In an embodiment, nozzle structure 365 is partially made out of molybdenum, which is not brittle compared to crystalline materials like diamond and silicon.

Just before the fuel (e.g., molten tin) exits the orifice 367, it is accelerated to a high velocity due to the pressure difference over the orifice 367 and the low pressure environment (e.g., near vacuum) in the source. The high speed fuel droplets are the result of a controlled break-up of a continuous jet issuing directly from this orifice 367 in the direction marked with the arrow 560, into the low pressure environment of the source.

So, a challenge is that the nozzle structure 365 should withstand high pressures (and thus be made of high strength material) as it acts as the interface between fuel at, e.g., greater than or equal to 8,000 psi and the low pressure (e.g., near vacuum) in the source. A further challenge of the nozzle structure 365 is that the orifice 367 should be of high quality in terms of shape and surface roughness in order to produce stable droplets. In an embodiment, the orifice 367 has a roundness of 50-150 nm on 1-10 µm. In an embodiment, the orifice 367 has an inner surface smoothness of 1-20 nm RMS. In an embodiment, the orifice 367 has a sharp edge 630 with, in an embodiment, an edge radius of less than or equal to 100 nm. In an embodiment, the orifice 367 has substantially no particle contamination and no chemical contamination. In an embodiment, the orifice 367 has a chemically inert inner surface with respect to the fuel and any contamination thereof.

In an embodiment, the nozzle structure 365 is in the form of plate or in other words a nozzle plate. That is, it is generally wider than thick. In an embodiment, the nozzle structure 365 is disk shaped. In an embodiment, the nozzle structure 365 is rectangular shaped. In an embodiment, the nozzle structure 365 is in the form of a block. In an embodiment, the nozzle structure 365 is in the form of a cube or cuboid.

Manufacturing a high quality orifice in a high strength material can be a difficult task. Accordingly, there is provided methods that allow for producing an orifice in a hard material within one or more of the specifications described herein. That is, there is provided a controlled production method for a high quality orifice in a high strength (and fuel compatible) material.

A difficulty for the manufacturing of the orifice 367 is to obtain a smooth hole (e.g., desirably a circular hole) in a high strength material (that is compatible with the fuel), such as diamond, tungsten, SiC, tantalum, silicon, rhenium, and/or $Al_2O_3$.

In an embodiment of the orifice 367 making process, to facilitate the orifice making process, an inlet 500 (e.g., a conical inlet) is made within a block of material that will form the nozzle structure 365. The inlet 500 does not pass all the way through the block of material of the nozzle structure 365. Rather, it leaves a membrane that has a relatively thin thickness 540. In an embodiment, the thickness 540 is selected from the range of about 20 µm-150 µm or selected from the range of about 50 µm-80 µm. The orifice 367 is made in this membrane. In an embodiment, the inlet 500 has a cross-sectional width 520 (e.g., diameter) selected from the range of about 100 µm-600 µm. In an embodiment, the inlet 500 has an opening angle 530 selected from the range of about 0-40 degrees.

In an embodiment, the orifice 367 is created in the membrane (e.g., made of diamond) by laser ablation followed by focused ion beam (FIB) milling. That is, in a first step, laser ablation is used to produce a relatively low quality pilot hole having a smaller cross-sectional width (e.g., selected from the range of about 1 µm-6 µm) than the cross-sectional width 600 of the final orifice 367. Due to the fundamentals of the ablation process, the quality of this hole does not fulfill the specifications (e.g., on roundness, smoothness, sharpness, etc.). In an embodiment, the spot of the laser in the laser ablation process has a cross-sectional dimension smaller than or equal to the cross-sectional width of the pilot hole.

Then, using the relatively low quality hole, focused ion beam (FIB) milling is used to rework the low quality hole into the high quality orifice 367 of the correct geometry and within specification. Using only FIB might not be able to produce orifice 367 of the correct geometry and within specification as the material that is removed with FIB needs to exit the hole from the top. This results in erosion and re-deposition effects when FIB is used without a pilot hole. Additionally or alternatively, the thickness of the membrane may be too thick for FIB to drill through without the pilot hole.

In an embodiment of the orifice 367 making process, the orifice 367 is created in the membrane resulting after creating inlet 500, by inductive coupled plasma (ICP) etching. In this case, no pilot hole may be necessary. In an embodiment, a hard mask with an opening of the desired cross-sectional width 600 is provided on the material of the nozzle structure 365 (e.g., by a resist-based lithography process by which the opening in the hard mask is created by etching away, via a patterned resist layer, hard mask material that was deposited/coated on the nozzle structure 365 material). Then, the ICP etching proceeds by using the hard mask as the template to form the orifice 367. In an embodiment, the hard mask comprises tantalum. In an embodiment, the ICP etching uses a fluorine-based etchant gas.

In an embodiment of the orifice 367 making process, the orifice 367 is created in the membrane resulting after creating inlet 500, by laser ablation. In this case, no pilot hole may be necessary. In an embodiment, only certain nozzle structure 365 materials may enable using laser ablation to produce a sufficient quality hole by only using laser ablation. In an embodiment, the material of the nozzle structure 365 comprises tungsten.

In an embodiment, the membrane can be a separate piece of material into which orifice 367 is made using any of the methods described above. The membrane can then be attached to a structure having the inlet 500, for example, an annular structure, so that the orifice 367 lines up with the inlet 500.

In an embodiment, one or more surfaces and/or edges of the nozzle structure 365 are smooth. In an embodiment, the one or more surfaces and/or edges have a Ra of less than or equal to 20 nm or less than or equal to 10 nm. In an embodiment, the surface 620 and/or surface 720 has a Ra of less than or equal to 20 nm or less than or equal to 10 nm. In an embodiment, the surface 620 and/or surface 720 extends up to or equal to 200 µm or up to or equal to 100 µm from the edge of the orifice 367. In an embodiment, the inside surface of the orifice 367 has a Ra of less than or equal to 10 nm. In an embodiment, a coating is applied (e.g., by atomic layer deposition) to the nozzle structure 365 and/or orifice 367 to provide, or facilitate, the smoothness. In an embodiment, the coating helps to reduce surface wear and/or to make the surface chemically inert for the fuel and any contamination thereof. In an embodiment, the edge 630 is rounded and has a radius of curvature larger than or equal to 5 micrometers or larger than or equal to 1 micrometer.

In an embodiment, the arrangement of nozzle structure 365 and orifice 367 can be thoroughly cleaned as a single part before further integration in the droplet generator.

In an embodiment, the nozzle structure 365 and orifice 367 can be provided in one of two configurations.

In a first configuration depicted in FIG. 7, the orifice 367 contracts in the direction of the flow 560 of the fuel material. Thus, the fluid jet detaches at the exit of the orifice 367 at the edge 630. In this arrangement, the cross-sectional width of the jet is about 0.9 times the cross-sectional width 600 of the orifice 367. In this arrangement, there can be relatively low nozzle edge 630 wear. Further, surface roughness should be low, e.g., to avoid boundary layer turbulence.

In a second configuration depicted in FIG. 8, the orifice 367 expands in the direction of the flow 560 of the fuel material. Thus, the fluid detaches at the entrance of the orifice 367 at the edge 630. In this arrangement, the cross-sectional width of the jet is about 0.8 times the cross-sectional width 600 of the orifice 367. In this arrangement, the contact line of the jet is geometrically pinned. Further, the inside surface of the orifice 367 does not contact the jet thus limiting potential turbulence. Further, in this arrangement, the jet contracts more than the embodiment of FIG. 7 and so the opening can be bigger than the opening of FIG. 7 to yield a same jet cross-sectional width as the opening of FIG. 7. This is beneficial for, e.g., contamination since a particle size in the fuel, that may clog the opening, can be larger. Further, the manufacturability can be improved because it may be relatively easier to make a larger opening to yield a same size jet. In this arrangement, there can be some nozzle edge 630 wear.

Referring to FIGS. 9 and 10, an embodiment of a part of a droplet generator 300 are shown in respectively a first cross section and a second cross section through a plane perpendicular to that of the first cross section. One or more of the features of this embodiment can be combined into any of the earlier described embodiments, or substituted for one or more features of any of the earlier described embodiments. For example, the actuator 320 (and optionally transfer structure 920) described hereafter can be used in place of the actuator 320 described in respect of FIGS. 3-5. As another example, the electrical connection 387 described hereafter can be used in place of the electrical connection 387 and/or actuator support 340 described in respect of FIGS. 3-5. As a further example, the structures 900, 910 described hereafter can be used in place of the actuator support 340, guide block 345, helical spring 350 and ball type joint 355 described in respect of FIGS. 3-5.

Like the droplet generator 300 described above, one or more fuel supply channels 305 are provided that are connected to a pump chamber 310. As shown more clearly in FIG. 10, the fuel supply channels 305 can be connected to the pump chamber 310 via smaller channels (restrictions) referred to herein as throttles 315. The fuel supply channels 305, throttles 315 and (at least part of) the pump chamber 310 may be all formed within a fuel modulator housing 385.

An actuator 320, comprising actuating components 320a and 320b, is located close to pump chamber 310. In this example, the actuator 320 comprises piezo disks or plates 320a, 320b, though it may be any suitable actuator for generating droplets. In this example, the actuator 320 comprises a plurality of actuating components 320a, 320b that each can separately provide a force. A control system (not shown) is provided to control the actuation by each of the actuating components 320a, 320b. In an embodiment, the control system drives the actuating components 320a, 320b such that the amplitudes of the actuating components 320a, 320b of the actuator 320 in series enable creation of droplets, and in an embodiment, the components 320a, 320b are driven to maintain a same phase of their vibrations to enable droplets to be accurately and appropriately created by controlled jet break-up.

The actuator may be separated from pump chamber 310 by membrane 335, to ensure that the actuator 320 is not contacted by the metal fuel. In an embodiment, the membrane 335 comprises the wall of pump chamber 310.

In an embodiment, a transfer structure (e.g., a plate) 920 is provided to physically connect the actuator 320 (e.g., a piezo 320b element of the actuator 320) to the membrane 335. In an embodiment, the transfer structure 920 has a curved mating (e.g., spherical surface) with the membrane 335. The transfer structure 920 can enable control of the value of the contact stiffness between the membrane 335 and the actuator 320.

An electrical connection 387 to the actuator 320 is shown. In an embodiment with a single actuating element of actuator 320 as described above, one electrical contact can be made via, e.g., the membrane to ground, and another can be made by a connection inside an insulating bushing that transfers a pretension of a spring 350 to the actuating element. In this case, a plurality of actuator elements is provided and so an intervening electrical contact is provided, while the other electrical contacts of the actuating components are connected to ground (e.g., via the membrane 335 for component 320b and via the structure 910 for component 320a).

In an embodiment, the electrical connection 387 comprises a conduit or sleeve for the one or more electrical connections to the one or more actuating components 320a, 320b (e.g., one or more piezo elements) of the actuator 320.

In an embodiment, the electrical connection 387 is a mechanical connection between components 320a, 320b of the actuator 320. In an embodiment, the electrical connection 387 is designed in terms of stiffness, natural frequency of vibration, etc. to enable the use of the amplitudes of the actuating components 320a, 320b of the actuator 320 in series, wherein the components 320a, 320b are driven to maintain a same phase of their vibrations to enable droplets to be appropriately created. Thus, the electrical connection 387 design is made such that for the operating frequencies, the transfer of action of the actuating components 320a, 320b of the actuator 320 is maintained as synchronized as possible and that the actuating components 320a, 320b are working in phase so that the amplitudes of the actuating components 320a, 320b can be added.

In an embodiment, the electrical connection 387 is electrically insulated from the housing 385. As the actuators 320a and 320b are supposed to act in series, the electrical connection 387 is, in an embodiment, kept free of contact with the housing. If the electrical connection 387 is mounted loose in the housing, the pretension force is present on actuating elements 320a, 320b all the time (both at room and operating temperature).

On the other side of the actuator 320 from the membrane 335 is an actuator support structure. In an embodiment, the actuator support structure comprises a plurality (in this case, two) of structures 900, 910. Like the spring 350, the structures 900, 910 enable pre-tension of the actuator 320 in contact with the membrane 335. In an embodiment, each of the structures 900, 910 comprises a wedge. In an embodiment, structure 900 can be part of the housing 385 and thus structure 900 need not be an individual component.

As shown in FIG. 9, the structures 900, 910 have angled surfaces, for example, with respect to the vertical shown in FIG. 9. So, by sliding one or more of the structures 900, 910 with respect one or more other of the structures 900, 910 in a first direction (e.g., the vertical shown in FIG. 9), a well-defined displacement can be generated in a second direction (e.g., the horizontal shown in FIG. 9) perpendicular to the first direction that deforms the membrane 335. Thus, the structures 900, 910 transform a displacement in the direction of the sliding into a displacement in a direction perpendicular to the sliding. The deformed membrane 335 exerts a pre-tension force on the actuator 320.

In an embodiment, one or more actuators (not shown) can be provided to cause the relative displacement between the structures 900, 910. In an embodiment, during assembly, the pretension can be provided by a controlled relative movement between the structures 900, 910 by means of an adjustment screw mounted in the assembly tool.

In an embodiment, there is provided a droplet generator for a lithographic system, the droplet generator operable to receive fuel pressurized at a fuel pressure, the droplet generator comprising a nozzle assembly operable to emit the fuel in the form of droplets, wherein the nozzle assembly is within, or substantially within, a pressurized environment, the pressurized environment being pressurized substantially at the same pressure as the fuel pressure.

In an embodiment, the entire fuel path within the droplet generator is within the pressurized environment. In an embodiment, the droplet generator is housed within a housing and the interior of the housing is pressurized substantially at the same pressure as the fuel pressure. In an embodiment, the fuel and the pressurized environment are each pressurized by a pressurization gas supply at the same pressure. In an embodiment, the fuel and the pressurized environment are each pressurized by the same pressurization gas supply. In an embodiment, the pressurization gas supply comprises argon. In an embodiment, the nozzle assembly comprises a nozzle structure, a pump chamber in which fuel within the pump chamber is actuated on by an actuator, and a duct connecting the pump chamber and the nozzle structure. In an embodiment, the droplet generator comprises the actuator in contact with and biased against the pump chamber by means of a biasing mechanism comprising an actuator support which is biased against the actuator, the actuator being operable to act on the fuel within the pump chamber so as to cause the breakup of the fuel such that the fuel is output from the nozzle as droplets, wherein a pressurization gas is introduced between the contacting surfaces of the actuator and pump chamber, and between the contacting surfaces of the actuator and the actuator support. In an embodiment, the nozzle structure is comprised of a material sufficiently strong to withstand the pressure differential between the pressurized fuel and a near vacuum. In an embodiment, the nozzle structure is comprised of one of silicon, a compound of silicon, tungsten, molybdenum, rhenium, diamond, $Al_2O_3$ or titanium. In an embodiment, actuation of the actuator causes the pressurization gas between the contacting surfaces to become super-critical so as to improve coupling of the actuator with the pump chamber and with the actuator support. In an embodiment, the actuator and pump chamber are separated by a membrane forming a wall of the pump chamber, the wall comprising the contacting surface of the pump chamber which contacts the actuator. In an embodiment, the actuator support is comprised of a material with a greater coefficient of thermal expansion than its surrounding structure, such that it is moveable within the surrounding structure at ambient temperature, but expands against the surrounding structure at an operating temperature of the droplet generator, thereby clamping the actuator support against the surrounding structure at the operating temperature. In an embodiment, the actuator support is comprised of a first part and a second part separated by an articulated joint allowing rotational movement between the first part and the second part so as to enable parallel alignment of the contacting surfaces of the actuator support and the actuator. In an embodiment, the actuator support is conductive and forms part of the electrical circuit for the actuator on a first side of the actuator. In an embodiment, the surrounding structure forms part of the electrical circuit for the actuator on a second side of the actuator. In an embodiment, the pump chamber is connected to a fuel supply via an acoustic filter. In an embodiment, the acoustic filter comprises a restriction in the fuel flow path between the fuel supply and pump chamber. In an embodiment, the pump chamber is configured as a Helmholtz resonator. In an embodiment, the length between the pump chamber and an output orifice of the nozzle is optimized for a desired droplet frequency. In an embodiment, the actuator is a piezo actuator. In an embodiment, the droplet generator further comprises a fuel reservoir to supply the fuel.

In an embodiment, there is provided a droplet generator for a lithographic system, the droplet generator being operable to emit fuel in the form of droplets out of a nozzle and comprising an actuator in contact with, and biased against, a pump chamber by means of a biasing mechanism comprising an actuator support which is biased against the actuator, the actuator operable to act on the fuel within the pump chamber so as to cause breakup of the fuel such that the fuel is output from the nozzle as droplets, wherein the actuator support is comprised of a material with a greater coefficient of thermal expansion than its surrounding structure, such that it is moveable within the surrounding structure at ambient temperature, but expands against the surrounding structure at an operating temperature of the droplet generator, so as to clamp the actuator support against the surrounding structure at the operating temperature.

In an embodiment, the actuator and pump chamber are separated by a membrane forming a wall of the pump chamber, the wall comprising the contacting surface of the pump chamber which contacts the actuator. In an embodiment, the actuator support is comprised of a first part and a second part separated by an articulated joint allowing rotational movement between the first part and the second part thereby enabling parallel alignment of the contacting surfaces of the actuator support and the actuator. In an embodiment, the actuator support is conductive and forms part of the electrical circuit for the actuator on a first side of the actuator. In an embodiment, the surrounding structure forms part of the electrical circuit for the actuator on a second side of the actuator.

In an embodiment, there is provided a droplet generator for a lithographic system being operable to emit fuel in the form of droplets out of a nozzle and comprising an actuator in contact with and biased against a pump chamber by means of a biasing mechanism comprising an actuator support which is biased against the actuator, the actuator operable to act on the fuel within the pump chamber so as to cause the breakup of the fuel such that the fuel is output from the nozzle as droplets, wherein the actuator support is comprised of a first part and a second part separated by an articulated joint allowing rotational movement between the first part and the second part so as to enable parallel alignment of the contacting surfaces of the actuator support and the actuator.

In an embodiment, there is provided a droplet generator for a lithographic system, the droplet generator being operable to emit fuel in the form of droplets out of a nozzle and comprising an actuator in contact with, and biased against, a pump chamber by means of a biasing mechanism comprising an actuator support which is biased against the actuator, the actuator operable to act on the fuel within the pump chamber so as to cause breakup of the fuel such that the fuel is output from the nozzle as droplets, wherein the nozzle is divergent or convergent in the direction of exhaust of the fuel from the nozzle.

In an embodiment, the nozzle is divergent in the direction of exhaust of the fuel from the nozzle. In an embodiment, an opening angle of the nozzle is less than or equal to 40°. In an embodiment, the entrance orifice of the nozzle has a cross-sectional width selected from the range of 1-10 microns. In an embodiment, the edge of the entrance orifice has an edge radius of less than or equal to 100 nm. In an embodiment, a surface having the entrance orifice of the nozzle has a roughness Ra of less than or equal to 20 nm.

In an embodiment, there is provided a method of manufacturing a nozzle plate for a droplet generator, the method comprising using laser ablation to manufacture an orifice through a plate of material to at least partly form the nozzle of the nozzle plate.

In an embodiment, the method further comprises using focused ion beam milling to at least partly expand the orifice manufactured using laser ablation. In an embodiment, the method further comprises creating an inlet in the plate of material to leave a membrane into which the orifice is manufactured by laser ablation.

In an embodiment, there is provided a method of manufacturing a nozzle plate for a droplet generator, the method comprising using inductive coupled plasma etching with a hard mask, to manufacture an orifice through a plate of material to form the nozzle of the nozzle plate.

In an embodiment, the orifice of the nozzle has a cross-sectional width selected from the range of 1-10 microns. In an embodiment, material of the plate comprises one or more selected from: molybdenum, tungsten, titanium, rhenium, diamond, silicon, silicon carbide, silicon nitride, tantalum, and/or $Al_2O_3$. In an embodiment, the material of the plate comprises tungsten. In an embodiment, the material of the plate comprises diamond.

In an embodiment, there is provided a droplet generator for a lithographic system being operable to emit fuel in the form of droplets out of a nozzle and comprising an actuator in contact with and biased against a pump chamber by means of a biasing mechanism comprising a plurality of wedges configured to displace the actuator to deform a membrane between the actuator and the pump chamber, wherein at least one wedge of the plurality of wedges is displaceable in a sliding manner relative to another wedge of the plurality of wedges and the actuator is operable to act on the fuel within the pump chamber so as to cause the breakup of the fuel such that the fuel is output from the nozzle as droplets.

In an embodiment, a droplet generator as described herein is operable for use within an EUV radiation source within the lithographic system.

In an embodiment, there is provided an EUV radiation source comprising: a droplet generator as claimed in any preceding claim, configured to generate droplets of fuel towards a plasma generation location; and a laser configured to direct laser radiation at the droplets at the plasma formation location to generate, in use, a radiation generating plasma.

In an embodiment, there is provided a lithographic apparatus, comprising an EUV radiation source as provided herein configured to generate a beam of EUV radiation. In an embodiment, the lithographic apparatus further comprises: an illumination system configured to condition the radiation beam; a support constructed to support a patterning device, the patterning device configured to impart the radiation beam with a pattern in its cross-section to form a patterned radiation beam; a substrate table constructed to hold a substrate; and a projection system configured to project the patterned radiation beam onto a target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, different features or embodiments can be combined with other features or embodiments described herein. The descriptions above are intended to be illustrative, not limiting. Thus it will be apparent to one skilled in the art that modifications may be made to the invention as described without departing from the scope of the claims set out below.

The invention claimed is:

1. A droplet generator configured for use in a laser-produced plasma radiation source and configured for providing a stream of droplets of a liquid fuel at an exit, wherein:
   the droplet generator comprises:
      a nozzle assembly;
      an actuator; and
      a pump chamber;
         the pump chamber is configured to receive the liquid fuel under an input pressure higher than an exit pressure at the exit;
         the pump chamber is located between the actuator and the nozzle assembly;
         the actuator is configured to establish a pressure change in the liquid fuel held in the pump chamber;
      the nozzle assembly comprises:
         an inlet at the pump chamber;
         a nozzle structure at the exit of the droplet generator;
         a duct configured for establishing a path of the liquid fuel between the inlet and the exit;
         the droplet generator has a first chamber configured for accommodating the nozzle assembly;
         the first chamber has a first inlet for receipt of a gas under a further pressure that is substantially the same as the input pressure.

2. The droplet generator of claim 1, wherein:
   the droplet generator has a second chamber configured to accommodate the actuator; and
   the second chamber has a second inlet for receipt of the gas under the further pressure.

3. The droplet generator of claim 1, wherein
   the nozzle structure comprises a nozzle plate having an orifice being in fluid communication with the duct; and
   the orifice is configured to have the fuel exit the droplet generator to form the stream of the droplets.

4. The droplet generator of claim 3, wherein the nozzle structure comprises of one of: silicon, a compound of silicon, tungsten, molybdenum, rhenium, diamond, tantalum, or titanium.

5. The droplet generator of claim 1, wherein:
   the actuator is configured to establish the pressure change via a wall of the pump chamber; and
   the droplet generator comprises a spring configured to bias the actuator against the wall.

6. The droplet generator of claim 2, wherein:
   the actuator is configured to establish the pressure change via a wall of the pump chamber; and
   the droplet generator comprises a spring configured to bias the actuator against the wall.

7. The droplet generator of claim 1, wherein:
   the droplet generator comprises an actuator support configured to support the actuator;
   the actuator support includes a first part and a second part that form an articulated joint allowing rotational movement between the first part and the second part so as to enable alignment of the actuator support and the actuator.

8. The droplet generator of claim 2, wherein:
   the droplet generator comprises an actuator support configured to support the actuator;
   the actuator support includes a first part and a second part that form an articulated joint allowing rotational movement between the first part and the second part so as to enable alignment of the actuator support and the actuator.

9. The droplet generator of claim 1, wherein:
   the actuator is configured to establish the pressure change via a wall of the pump chamber;
   the droplet generator comprises a spring configured to bias the actuator against the wall;
   the droplet generator comprises an actuator support configured to support the actuator; and
   the actuator support includes a first part and a second part that form an articulated joint allowing rotational movement between the first part and the second part so as to enable alignment of the actuator support and the actuator.

10. The droplet generator of claim 2, wherein:
    the actuator is configured to establish the pressure change via a wall of the pump chamber;
    the droplet generator comprises a spring configured to bias the actuator against the wall;
    the droplet generator comprises an actuator support configured to support the actuator; and
    the actuator support comprises a first part and a second part that form an articulated joint allowing rotational movement between the first part and the second part so as to enable alignment of the actuator support and the actuator.

11. The droplet generator of claim 1, wherein:
    the droplet generator comprises an actuator support configured to support the actuator;
    the actuator support comprises a first part and a second part that form an articulated joint allowing rotational movement between the first part and the second part so as to enable alignment of the actuator support and the actuator;
    the droplet generator comprises a housing configured to accommodate the actuator support and made of a first material having a first coefficient of thermal expansion;
    the actuator support comprises a material that has a second coefficient of thermal expansion that is greater than the first coefficient of thermal expansion, such that the actuator support is moveable within the housing at ambient temperature, and expands against the housing at an operating temperature of the droplet generator, so as to clamp the actuator support against the housing at the operating temperature.

12. The droplet generator of claim 2, wherein:
    the droplet generator comprises an actuator support configured to support the actuator;
    the actuator support includes a first part and a second part that form an articulated joint allowing rotational movement between the first part and the second part so as to enable alignment of the actuator support and the actuator;
    the droplet generator comprises a housing configured to accommodate the actuator support and made of a first material having a first coefficient of thermal expansion;
    the actuator support comprises a material that has a second coefficient of thermal expansion that is greater than the first coefficient of thermal expansion, such that the actuator support is moveable within the housing at ambient temperature, and expands against the housing at an operating temperature of the droplet generator, so as to clamp the actuator support against the housing at the operating temperature.

13. The droplet generator of claim 1, wherein:
the droplet generator comprises an actuator support configured to support the actuator;
the actuator is configured to establish the pressure change via a wall of the pump chamber;
the droplet generator comprises a spring configured to bias the actuator against the wall; and
the droplet generator comprises a housing configured to accommodate the actuator support and made of a first material having a first coefficient of thermal expansion;
the actuator support comprises a material that has a second coefficient of thermal expansion that is greater than the first coefficient of thermal expansion, such that the actuator support is moveable within the housing at ambient temperature, and expands against the housing at an operating temperature of the droplet generator, so as to clamp the actuator support against the housing at the operating temperature.

14. The droplet generator of claim 2, wherein:
the droplet generator comprises an actuator support configured to support the actuator;
the actuator is configured to establish the pressure change via a wall of the pump chamber;
the droplet generator comprises a spring configured to bias the actuator against the wall; and
the droplet generator comprises a housing configured to accommodate the actuator support and made of a first material having a first coefficient of thermal expansion;
the actuator support comprises a material that has a second coefficient of thermal expansion that is greater than the first coefficient of thermal expansion, such that the actuator support is moveable within the housing at ambient temperature, and expands against the housing at an operating temperature of the droplet generator, so as to clamp the actuator support against the housing at the operating temperature.

15. A laser-produced plasma radiation source comprising a droplet generator configured for providing a stream of droplets of a liquid fuel at an exit, wherein:
the droplet generator comprises:
a nozzle assembly;
an actuator; and
a pump chamber;
the pump chamber is configured to receive the liquid fuel under an input pressure higher than an exit pressure at the exit;
the pump chamber is located between the actuator and the nozzle assembly;
the actuator is configured to establish a pressure change in the liquid fuel held in the pump chamber;
the nozzle assembly comprises:
an inlet at the pump chamber;
a nozzle structure at the exit of the droplet generator;
a duct configured for establishing a path of the liquid fuel between the inlet and the exit;
the droplet generator has a first chamber configured for accommodating the nozzle assembly;
the first chamber has a first inlet for receipt of a gas under a further pressure that is substantially the same as the input pressure.

16. The laser-produced plasma radiation source of claim 15, wherein:
the droplet generator has a second chamber configured to accommodate the actuator; and
the second chamber has a second inlet for receipt of the gas under the further pressure.

17. The laser-produced plasma radiation source of claim 15, wherein
the nozzle structure comprises a nozzle plate having an orifice being in fluid communication with the duct; and
the orifice is configured to have the fuel exit the droplet generator to form the stream of the droplets.

18. The laser-produced plasma radiation source of claim 17, wherein the nozzle structure comprises one of: silicon, a compound of silicon, tungsten, molybdenum, rhenium, diamond, tantalum, or titanium.

19. The laser-produced plasma radiation source of claim 15, wherein:
the actuator is configured to establish the pressure change via a wall of the pump chamber; and
the droplet generator comprises a spring configured to bias the actuator against the wall.

20. The laser-produced plasma radiation source of claim 15, wherein:
the droplet generator comprises an actuator support configured to support the actuator;
the actuator support includes a first part and a second part that form an articulated joint allowing rotational movement between the first part and the second part so as to enable alignment of the actuator support and the actuator.

21. The laser-produced plasma radiation source of claim 15, wherein:
the droplet generator comprises an actuator support configured to support the actuator; and
the droplet generator comprises a housing configured to accommodate the actuator support and made of a first material having a first coefficient of thermal expansion;
the actuator support comprises a material that has a second coefficient of thermal expansion that is greater than the first coefficient of thermal expansion, such that the actuator support is moveable within the housing at ambient temperature, and expands against the housing at an operating temperature of the droplet generator, so as to clamp the actuator support against the housing at the operating temperature.

* * * * *